(12) United States Patent
Vanden Brande et al.

(10) Patent No.: US 6,231,727 B1
(45) Date of Patent: May 15, 2001

(54) PROCESS FOR STRIPPING THE SURFACE OF A SUBSTRATE AND APPARATUS FOR IMPLEMENTING THIS PROCESS

(75) Inventors: Pierre Vanden Brande, Brussels; Alain Weymeersch, Wavre, both of (BE)

(73) Assignee: Recherche et Developpement du Groupe Cockerill Sambre, en Abrege RD-CS, Liege (BE)

( * ) Notice: Subject to any disclaimer, the term of this patent is extended or adjusted under 35 U.S.C. 154(b) by 0 days.

(21) Appl. No.: 09/165,300

(22) Filed: Oct. 2, 1998

(30) Foreign Application Priority Data

Oct. 8, 1997 (EP) .................................................. 97203136

(51) Int. Cl.⁷ .................................................. C23C 14/34
(52) U.S. Cl. ................................. 204/192.32; 204/192.35; 204/298.31; 204/298.34; 204/298.39
(58) Field of Search .................... 204/192.32, 192.35, 204/298.31, 298.34, 298.39; 156/345; 216/71

(56) References Cited

U.S. PATENT DOCUMENTS

| | | | |
|---|---|---|---|
| 2,867,912 | 1/1959 | Kritchever | 34/1 |
| 4,622,094 | 11/1986 | Otsubo | 156/627 |
| 5,178,739 | * 1/1993 | Barnes et al. | 204/192.12 |
| 5,283,087 | * 2/1994 | Yamazaki et al. | 427/577 |
| 5,300,189 | * 4/1994 | Kokaku et al. | 156/643 |

FOREIGN PATENT DOCUMENTS

535568A1   4/1993   (EP) ................................ C23G/5/00

OTHER PUBLICATIONS

JP 57–47331 abstract, Mar. 1982.*

* cited by examiner

*Primary Examiner*—Nam Nguyen
*Assistant Examiner*—Steven H. Ver Steeg
(74) *Attorney, Agent, or Firm*—Pillsbury Winthrop LLP

(57) ABSTRACT

Process for continuously stripping the surface of a substrate moving in a defined direction through a vacuum chamber past at least one counterelectrode, according to which process a plasma is created in a gas, between this counterelectrode and this surface, so as to generate radicals and/or ions which can act on the surface to be stripped, characterized in that at least one pair of successive counterelectrodes, past which the abovementioned chamber and in that an alternating potential is applied to these counterelectrodes so as to impose on the latter an alternately positive and negative potential with respect to the substrate.

14 Claims, 3 Drawing Sheets

PROCESS FOR STRIPPING THE SURFACE OF A SUBSTRATE AND APPARATUS FOR IMPLEMENTING THIS PROCESS

The present invention relates to a process for continuously stripping the surface of a substrate moving in a defined direction through a vacuum chamber past at least one counterelectrode, according to which process a plasma is created in a gas, between this counterelectrode and this surface, which plasma is such as to be able to generate radicals and/or ions which act on the said surface to be stripped.

One of the essential aims of the present invention is to provide a very effective process for stripping one or both surfaces of a substrate contaminated by a thin insulating layer, such as an oil film or a thin oxide layer, the thickness of which is preferably less than 1 micron, by using the known technique of sputtering on the surface to be cleaned.

The problem which generally arises when this technique is used for stripping substrates to be cleaned is that arcs form and the electric-current supply is cut off as a result of the presence of such an insulating layer.

Thus, it has proved to be the case that this technique has not been suitable, hitherto, for stripping an oily metal sheet without having to introduce a not insignificant amount of oxygen into the vacuum chamber.

According to the invention, this problem was unexpectedly solved by using, in the vacuum chamber in which the sputtering took place, at least one pair of successive counterelectrodes, past which the abovementioned substrate moves, and by applying an alternating potential to these counterelectrodes so as to charge the latter alternately positively and negatively with respect to the substrate, the latter preferably being earthed.

Advantageously, a magnetic circuit placed behind the substrate to be stripped is provided for each of the aforementioned counterelectrodes.

According to one particular embodiment of the invention, when the substrate is, for example, formed by a metal strip, a 50 Hz to 300 kHz, preferably 10 kHz to 300 kHz, for example about 200 kHz, alternating potential is applied to the aforementioned counterelectrodes.

The invention also relates to a device or apparatus for implementing the stripping process according to the invention.

This apparatus is essentially characterized in that it comprises a vacuum chamber in which at least one pair of successive counterelectrodes is mounted, transportation means for moving a substrate to be stripped successively past each of these two counterelectrodes, means allowing an alternating potential or current to be applied to these counterelectrodes, so as to charge the latter alternately positively and negatively with respect to the said substrate, and means for alternatively creating a plasma between one of these counterelectrodes and the substrate facing the latter in a gas which is such as to generate radicals and/or ions which can act on that surface of the substrate to be stripped which is turned towards the said counterelectrode.

Further details and features of the invention will emerge from the description given below, by way of non-limiting example, of a few particular embodiments of the invention, with reference to the appended drawings.

In these figures, the same reference numbers relate to similar or identical elements.

The present invention relates to an improved stripping process, using sputtering, which is particularly suitable for stripping electrically conductive substrates contaminated by a thin electrically insulating layer, such as an oil film or oxide film, the thickness of which is preferably less than 1 micron, or alternatively for cleaning polymer substrates.

In general, the process according to the invention is characterized in that at least one pair of successive counterelectrodes, past each of which the abovementioned substrate moves and to which an alternatingly positive and negative potential is applied, is used in a vacuum chamber.

Thus, when one of the two counterelectrodes is biased positively with respect to the other, the substrate facing this counterelectrode is itself biased negatively with respect to this first counterelectrode with the consequence that a bombardment by positive ions takes place.

At the same time, the reverse situation is observed at the other counterelectrode. The latter, which is biased negatively, repels the electrons in the plasma which tend to discharge the positive surface charge that was created in a previous cycle.

When the substrate is an electrical conductor, the apparatus allows erosion of the substrate but not of the counterelectrodes, as long as the working frequency is below a critical frequency of between one and several hundred kHz, depending on the working conditions (for example, the pressure in the chamber). This is because, below this maximum operating frequency, the discharge behaves as a DC discharge in each half-cycle. Thus, a stable plasma can form only near the negatively biased electrode when the latter is provided with a magnetic circuit placed on the opposite side from that of the electrode facing it, so as to constitute a magnetron-type device able to confine the electrons. As the magnetic circuits are placed close to the substrate and on the opposite side from that of the counterelectrodes, a discharge forms near the substrate when the latter is biased negatively with respect to one of the counterelectrodes whereas no discharge can form in a stable manner near a counterelectrode biased negatively with respect to the substrate, since this counterelectrode does not have a magnetic circuit constituting a magnetron-type device, i.e. allowing the electrons near it to be confined.

Figure 1:
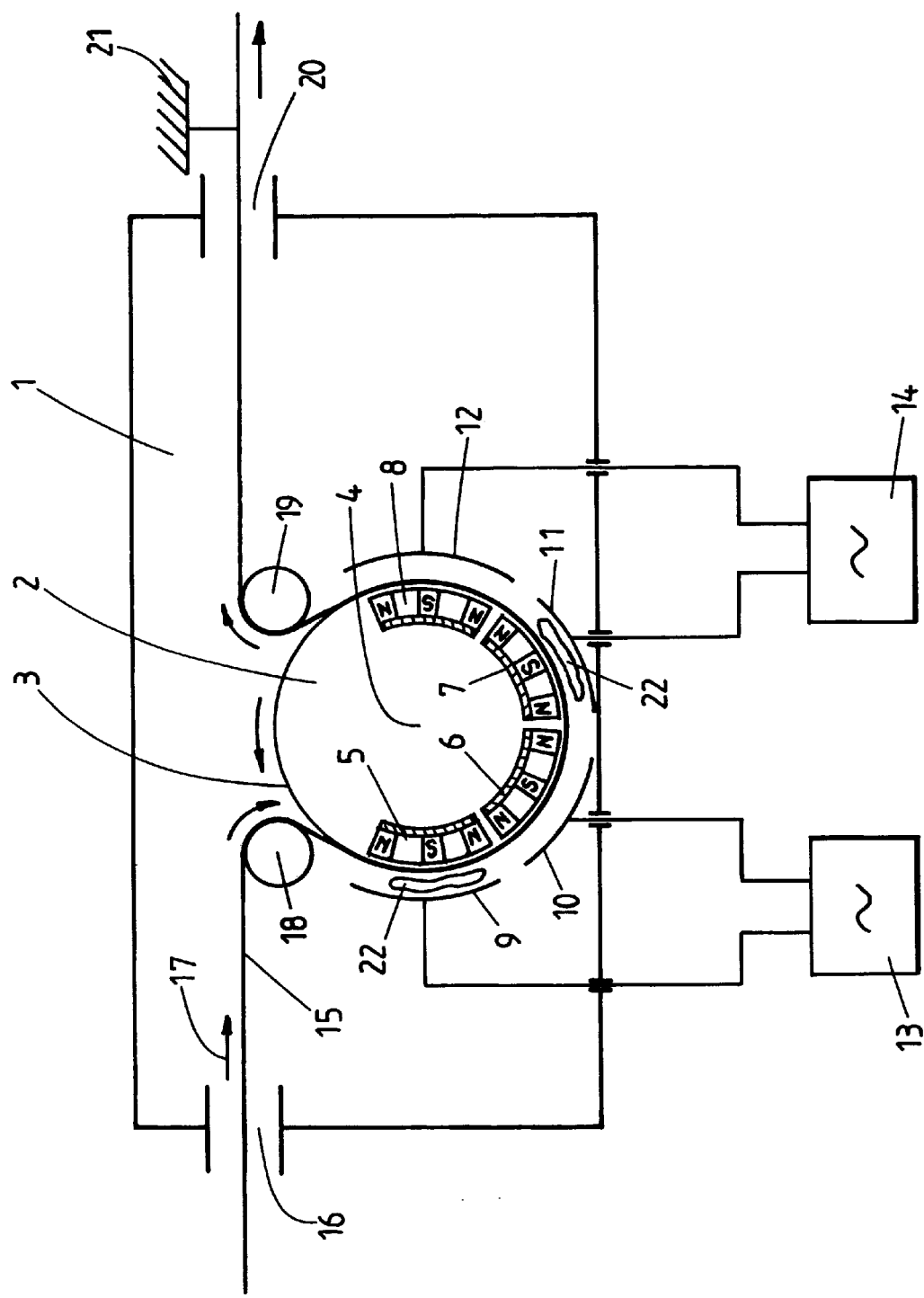
FIG. 1 is a diagrammatic side view of a first embodiment of an apparatus according to the invention for continuously stripping a steel sheet.

FIG. 1 shows diagrammatically a first embodiment of an apparatus allowing the process according to the invention to be implemented.

This apparatus comprises a vacuum chamber 1 in which a drum 2, having a cylindrical surface 3 and able to rotate about an axis 4, is mounted.

Mounted inside this drum 2 are four fixed magnetrons 5 to 8 which extend close to the internal face of the cylindrical wall of the drum and allow a magnetic circuit to be generated. Two pairs of successive counterelectrodes 9, 10 and 11, 12 are placed on the outside of the drum 2, at a constant distance from the cylindrical surface 3 of the latter. These counterelectrodes extend along a cylindrical surface coaxial with the drum 2. Each pair of counterelectrodes 9, 10 and 11, 12 is supplied by an AC generator 13 and 14, respectively.

A substrate, formed in this particular case by a continuous steel sheet or strip 15, enters the vacuum chamber 1 via an inlet 16 provided in one of the side walls of this chamber and moves through this chamber 1 in the direction of the arrow 17, the sheet being turned around a first return roll 18 rotating freely about an axis parallel to that of the drum, in order to be applied against the cylindrical external face 3 of the latter, and to be turned around a second return roll 19 towards an outlet 20 provided in the wall opposite that in which the inlet 16 is provided.

In this particular embodiment, the sheet 15 is earthed, as indicated diagrammatically at 21.

The chamber generally contains a gas mixture consisting of argon and a reactive gas, for example hydrogen or oxygen, the ratio of which may vary between very wide limits.

Advantageously, there is no separation between two successive electrodes so as to allow the charged particles laying opposite a counterelectrode region to move freely towards the other region.

Thus, when the counterelectrode 9 or 11, for example, is biased positively, that part of the sheet 15 passing opposite this electrode is biased negatively and a plasma 22 is formed there and is confined by the presence of the magnetic circuits 5 and 7, resulting in bombardment of the sheet 15 by positive ions.

At the same time, the counterelectrodes 10 and 12, which are biased negatively, expel electrons which move towards the substrate, thus ensuring the current return.

Therefore, given that in a next step the counterelectrodes 9 and 11 are charged negatively and the counterelectrodes 10 and 12 are biased positively, the phenomenon described above is reversed.

Advantageously, an alternatingly positive and negative potential, having approximately the same absolute value with respect to the potential of the substrate, is imposed on the counterelectrodes 9 to 12, such as a potential varying sinusoidally with respect to that of the substrate which is preferably maintained at earth potential, as already mentioned above.

Generally, an alternating potential having a frequency of 1 kHz to 1000 kHz is applied to these counterelectrodes 9 to 12 by current generators 13 and 14.

When the surface of the substrate to be stripped is electrically conductive and is, for example, formed by a sheet, good results are obtained when a 50 Hz to 300 kHz, preferably 10 kHz to 300 kHz, for example about 200 kHz, alternating potential is applied to the counterelectrodes 9 to 11.

On the other hand, if the substrate is a non-conductor and is, for example, formed by a polymer film, the frequency of the alternating potential applied to the counterelectrodes may, in some cases, reach 1000 kHz.

The distance between the substrate 15 and the counterelectrodes 9 to 12 generally varies between 1 and 20 cm.

Figure 2:
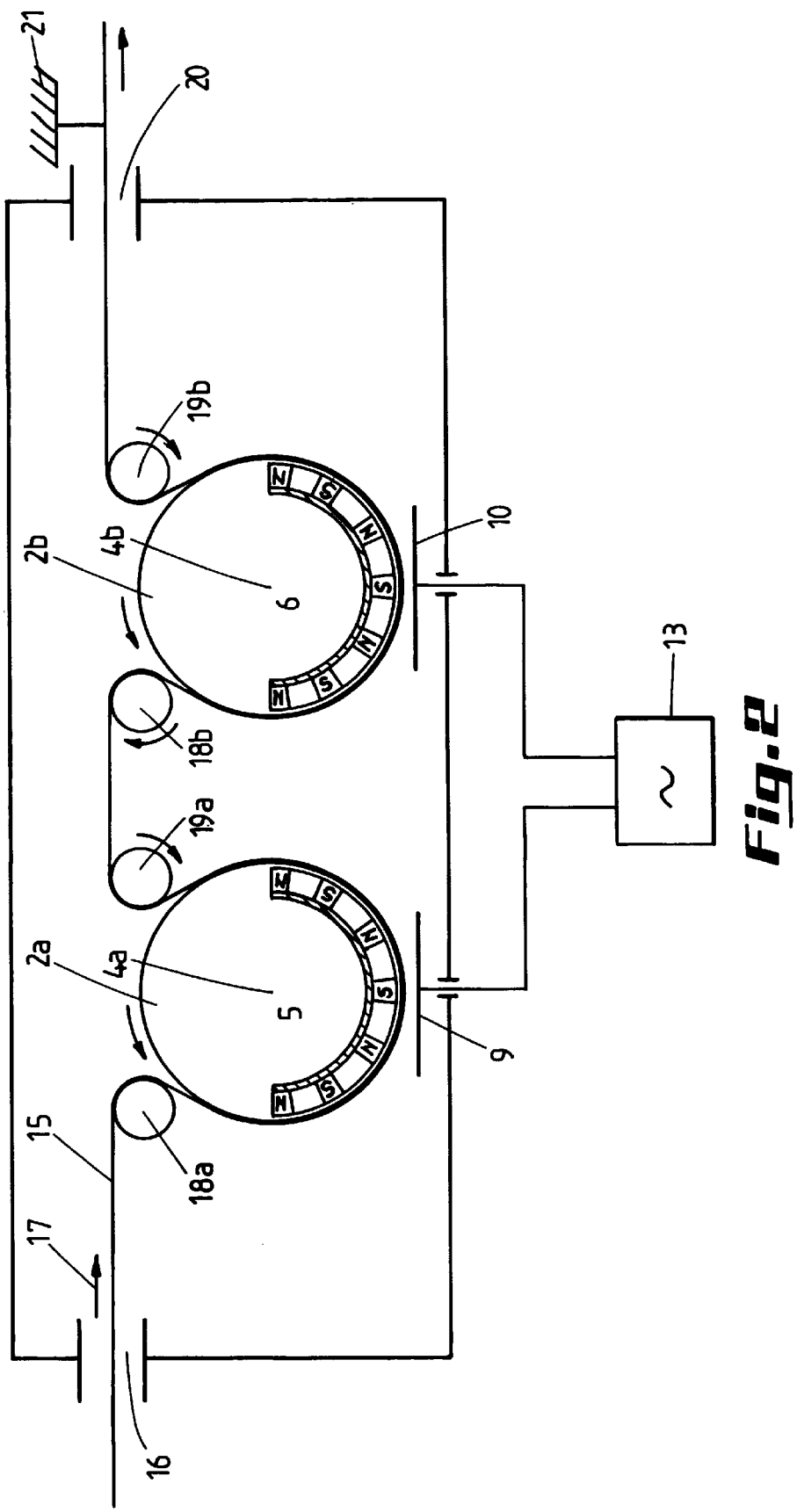
FIG. 2 is a view similar to that in FIG. 1 of a second embodiment of such an apparatus.

FIG. 2 relates to a second embodiment of an apparatus, which differs from that in FIG. 1 by the fact that the vacuum chamber 1 comprises two drums 2a and 2b of identical size and rotating about parallel axes 4a and 4b. In addition, only one pair of counterelectrodes 9 and 10 is provided, each having a plane shape.

One of these counterelectrodes, 9, extends opposite the drum 2a while the counterelectrode 10 extends opposite the drum 2b.

As in the embodiment according to FIG. 1, the substrate 15 is formed by a continuous strip turned in succession around each of the two drums 2a and 2b by means of return rolls 18a, 19a and 18b, 19b. For the rest, their operation is entirely identical to that of the apparatus in FIG. 1.

Figure 3:
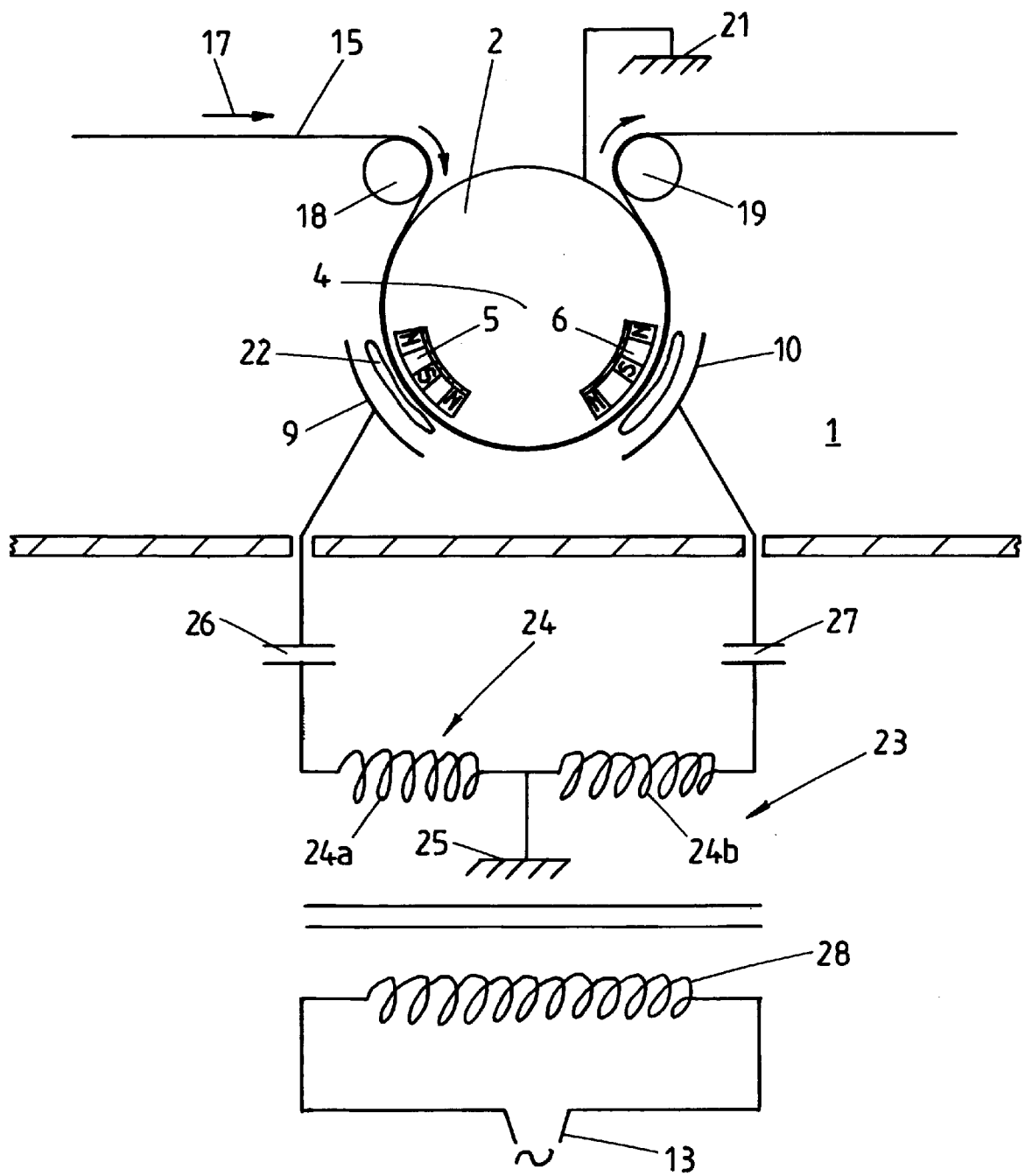
FIG. 3 is a view similar to that in FIGS. 1 and 2 of a third embodiment of such an apparatus.

FIG. 3 relates to an apparatus according to a third embodiment, which essentially differs from the previous ones by the fact that an alternating current is applied to the pair of electrodes 9 and 10 by means of a generator 13 via a transformer 23 which has a secondary winding 24 formed by two parts 24a and 24b in series, one of the ends of which is maintained at a fixed known potential, for example earth, as indicated at 25 in FIG. 3, and the other end of these parts 24a and 24b is connected via capacitors 26 and 27, respectively, to the counterelectrodes 9 and 10, respectively.

The power, especially AC power, generator 13 is connected to the primary winding 28 of the transformer 23.

In order to obtain a balanced distribution between the power to the two counterelectrodes 9 and 10, the two aforementioned parts 24a and 24b of the secondary winding 24 are identical and have the same number of turns. These parts are connected to the respective counterelectrodes 9 and 10 via capacitors 26 and 27, respectively, which are also identical from the standpoint of their capacitive properties.

That end of the two parts 24a and 24b of the secondary winding 24 which is not connected to the respective capacitor is advantageously maintained at the same potential as the substrate 15. In the present case, as already indicated above, both the substrate and that end are connected to earth.

If a drum is used whose cylindrical surface is electrically conductive, the connection to earth is made via this drum, as shown in FIG. 3.

In one particular embodiment according to the invention, for the treatment of a metal strip such as a strip of mild steel, aluminium or stainless steel, it is advantageous to use a gas mixture consisting of argon and optionally a reactive gas, such as hydrogen or oxygen, the content of which may vary between 5 and 50% by volume.

The pressure inside the vacuum chamber is, for example, maintained at $5 \times 10^{-3}$ torr.

The magnetron used is a conventional magnetron allowing electron confinement at the surface of the metal strip moving through the regions opposite the counterelectrodes.

The alternating power supply consists of an AC generator whose frequency may vary from 10 kHz to 100 kHz.

In some cases, pure argon or pure hydrogen may be used.

The subject of the invention is further illustrated by specific embodiment examples given below.

EXAMPLE 1

Decontamination, by medium-frequency magnetron stripping, of a mild-steel sheet which is highly contaminated by an oil film before it is vacuum-coated with a film of tin. Description of the Working Conditions for Treating One Face:

The line speed is 500 m/min;

Three units of the type shown in FIG. 1 are needed; each pair of counterelectrodes is connected to a 40 kHz HF generator allowing a working power of 200 kW to be dissipated;

The first two units are supplied with a mixture of 80% Ar and 20% $O_2$ and the gas flow rate is fixed in such a way that the working pressure is $5 \times 10^{-3}$ torr, thus allowing oxidation of the oil layer.

The third unit is supplied with a mixture of 80% Ar and 20% $H_2$ and the working pressure is $5 \times 10^{-3}$ torr so as to reduce the approximately 5 nm thick FeO layer present on the surface of the sheet.

After this treatment, the sheet is no longer contaminated with carbon and is free of its oxidation layer.

EXAMPLE 2

Treatment for activating the surface of a 20 µm thick polyethylene film in an oxygen/argon mixture before an $SiO_2$ film is deposited.

Description of the Working Conditions:

A single unit of the type in FIG. 1 is needed; The line speed is 400 m/min.

Each of the two generators delivers a 50 kW effective power at a frequency of 300 kHz.

The discharge is produced in a mixture of 70% Ar and 30% $O_2$ at a pressure of $5 \times 10^{-2}$ torr.

This treatment allows the adhesion of the $SiO_2$ film to be improved.

Of course, the invention is not limited to the embodiments described above and other variants may be envisaged both with regard to the construction of the apparatus and the operating conditions of the process applied.

What is claimed is:

1. A process for continuously stripping by sputtering the surface of a substrate moving in a defined direction through a vacuum chamber past at least one counterelectrode, according to which process a plasma is created in a gas, between this counterelectrode and this surface, so as to generate radicals and/or ions which can act on the said surface to be stripped, characterized in that at least one pair of successive counterelectrodes, past which the above mentioned substrate moves, is used in the vacuum chamber and in that an alternating potential is applied to these counterelectrodes so as to impose on the latter an alternately positive and negative potential with respect to the substrate, said pair of counterelectrodes comprising a first counterelectrode and a second counterelectrode wherein, at a certain time, said first counterelectrode is positively biased and said second counterelectrode is negatively biased.

2. A process according to claim 1, characterized in that a positive and negative potential having approximately the same absolute value with respect to the potential of the substrate is alternately imposed on the counterelectrodes.

3. A process according to claim 2, wherein said potential varies sinusoidally with respect to that of the substrate.

4. Process according to either of claims 1 and 2, characterized in that an alternating current is applied to said pair of successive counterelectrodes by means of a transformer having a secondary winding formed from two parts in series, one of the ends of which is maintained at a fixed known potential, the other end of one of the said parts being connected, optionally via a capacitor, to one of the counterelectrodes and the other end of the other part being connected, optionally via a capacitor, to the other counterelectrode.

5. Process according to claim 4, characterized in that a transformer, the two aforementioned parts of the secondary winding of which are substantially identical and are connected to the respective counterelectrode via capacitors which are also substantially identical from the capacitive properties standpoint, is used.

6. Process according to claim 4, characterized in that one of the ends of the two parts of the secondary winding is maintained at substantially the same potential as the substrate.

7. Process according to claim 1 or 2, characterized in that the substrate is maintained at earth potential.

8. Process according to claim 1 or 2, characterized in that each counterelectrode is provided with a magnetic circuit serving to confine electrons of the plasma and placed behind that face each of the substrate which is to be stripped and opposite each of these counterelectrodes.

9. Process according to claim 1 or 2, characterized in that an alternating potential having a frequency of 1 Hz to 1000 kHz is applied to the counterelectrodes.

10. A process according to claim 9, characterized in that, when the surface to be stripped is electrically conductive a 50 Hz to 300 kHz alternating potential is applied to the counterelectrodes.

11. A process according to claim 9, characterized in that, when the surface to be stripped is electrically conductive a 10 kHz to 100 kHz alternating potential is applied to the counterelectrodes.

12. A process according to claim 1 or 2, characterized in that the substrate is formed by a continuous steel strip.

13. A process according to claim 12, wherein said strip is formed of a material selected from the group consisting of mild-steel, aluminum, or stainless-steel.

14. An Apparatus for continuously stripping by sputtering the surface of a substrate comprising a vacuum chamber in which at least one pair of successive counterelectrodes is mounted, transportation means for moving a substrate to be stripped by sputtering successively past each of these two counterelectrodes, means allowing an alternating potential or current to be applied to these counterelectrodes, so as to charge the latter alternately positively and negatively with respect to the said substrate, and means for alternately creating a plasma between one of these counterelectrodes and the substrate facing the latter in a gas which is such as to generate radicals and/or ions which can act on that surface of the substrate to be stripped which is turned towards the said counterelectrode, said pair of counterelectrodes comprising a first counterelectrode and a second counterelectrode and said means allowing an alternating potential or current to be applied to these counterelectrodes are provided at a certain time, to charge said first counterelectrode positively and said second counterelectrode negatively.

* * * * *